United States Patent
Tieben et al.

(10) Patent No.: US 7,578,407 B2
(45) Date of Patent: Aug. 25, 2009

(54) WAFER CONTAINER WITH SEALABLE DOOR

(75) Inventors: Anthony Mathius Tieben, Jordan, MN (US); John Lystad, Bloomington, MN (US)

(73) Assignee: Entegris, Inc., Chaska, MN (US)

( * ) Notice: Subject to any disclaimer, the term of this patent is extended or adjusted under 35 U.S.C. 154(b) by 534 days.

(21) Appl. No.: 11/108,349

(22) Filed: Apr. 17, 2005

(65) Prior Publication Data

US 2005/0230284 A1 Oct. 20, 2005

Related U.S. Application Data

(60) Provisional application No. 60/563,529, filed on Apr. 18, 2004.

(51) Int. Cl.
*B65D 45/16* (2006.01)
*B65D 53/00* (2006.01)
*B65D 53/02* (2006.01)

(52) U.S. Cl. .................. 220/326; 220/378; 220/803; 220/804

(58) Field of Classification Search ............. 220/795, 220/378, 324, 803, 804, 326, 797
See application file for complete search history.

(56) References Cited

U.S. PATENT DOCUMENTS

| | | | | |
|---|---|---|---|---|
| 4,206,499 | A | * | 6/1980 | Urbanek et al. ............ 362/546 |
| 4,248,346 | A | | 2/1981 | Johnson |
| 4,313,609 | A | * | 2/1982 | Clements .................... 277/641 |
| 4,349,206 | A | * | 9/1982 | Simm et al. ................. 277/612 |
| 4,709,834 | A | | 12/1987 | Mortensen et al. |
| 5,273,159 | A | | 12/1993 | Gregerson |
| 5,586,658 | A | | 12/1996 | Nyseth |
| 5,611,452 | A | | 3/1997 | Bonora et al. |
| 5,711,427 | A | | 1/1998 | Nyseth |
| 5,740,845 | A | | 4/1998 | Bonora et al. |
| 5,957,292 | A | | 9/1999 | Mikkelsen et al. |
| 6,187,182 | B1 | | 2/2001 | Reynolds et al. |
| 6,273,261 | B1 | | 8/2001 | Hosoi |
| 6,354,601 | B1 | | 3/2002 | Krampotich et al. |
| 6,663,148 | B2 | | 12/2003 | Bonora et al. |

(Continued)

*Primary Examiner*—Anthony D Stashick
*Assistant Examiner*—Niki M Eloshway
(74) *Attorney, Agent, or Firm*—Patterson, Thuente, Skaar & Christensen, P.A.

(57) ABSTRACT

A wafer container including an enclosure portion with a door frame defining an opening for insertion and removal of wafers and a door fittable in the door frame to seal the enclosure portion. A continuous elastomeric seal extends around the door inward of the periphery. The seal is positioned on a sealing surface proximate the perimeter of the door and may be partially inset in a radial groove in the door. In cross-section, the elastomeric seal has an inset portion and a sealing head coupled by a bridging portion. The sealing head has a foot portion projecting from the bridging portion toward the sealing surface of the door, and a head portion extending in a direction generally opposite the foot relative to the bridging portion. The door frame has a seal engaging structure so that when the door is seated in the door frame, the bridging portion of the elastomeric seal contacts the seal engaging structure displacing the bridging portion axially toward the sealing surface and causing the head of the sealing head to rotate radially and contact the seal engaging structure. The displacement action also affirmatively sets the foot of the sealing head in contact with the sealing surface of the door.

6 Claims, 13 Drawing Sheets

U.S. PATENT DOCUMENTS

| | | | |
|---|---|---|---|
| 6,848,578 B2 * | 2/2005 | Eggum | 206/454 |
| 6,989,160 B2 * | 1/2006 | Chauhan et al. | 424/725 |
| 7,029,013 B2 * | 4/2006 | Yajima et al. | 277/637 |
| 2002/0195455 A1 | 12/2002 | Takahashi et al. | |
| 2006/0249512 A1 * | 11/2006 | Ueda et al. | 220/378 |

* cited by examiner

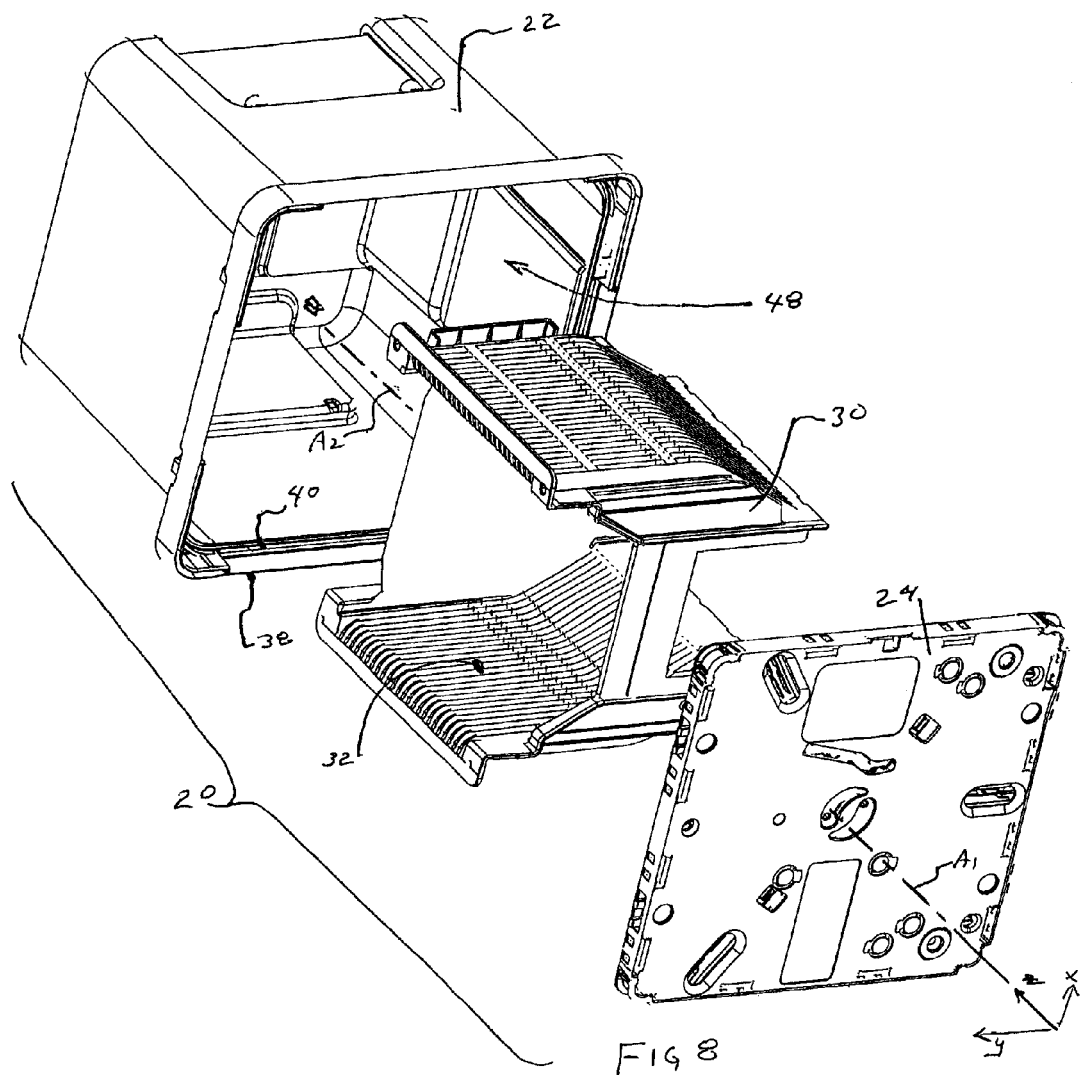

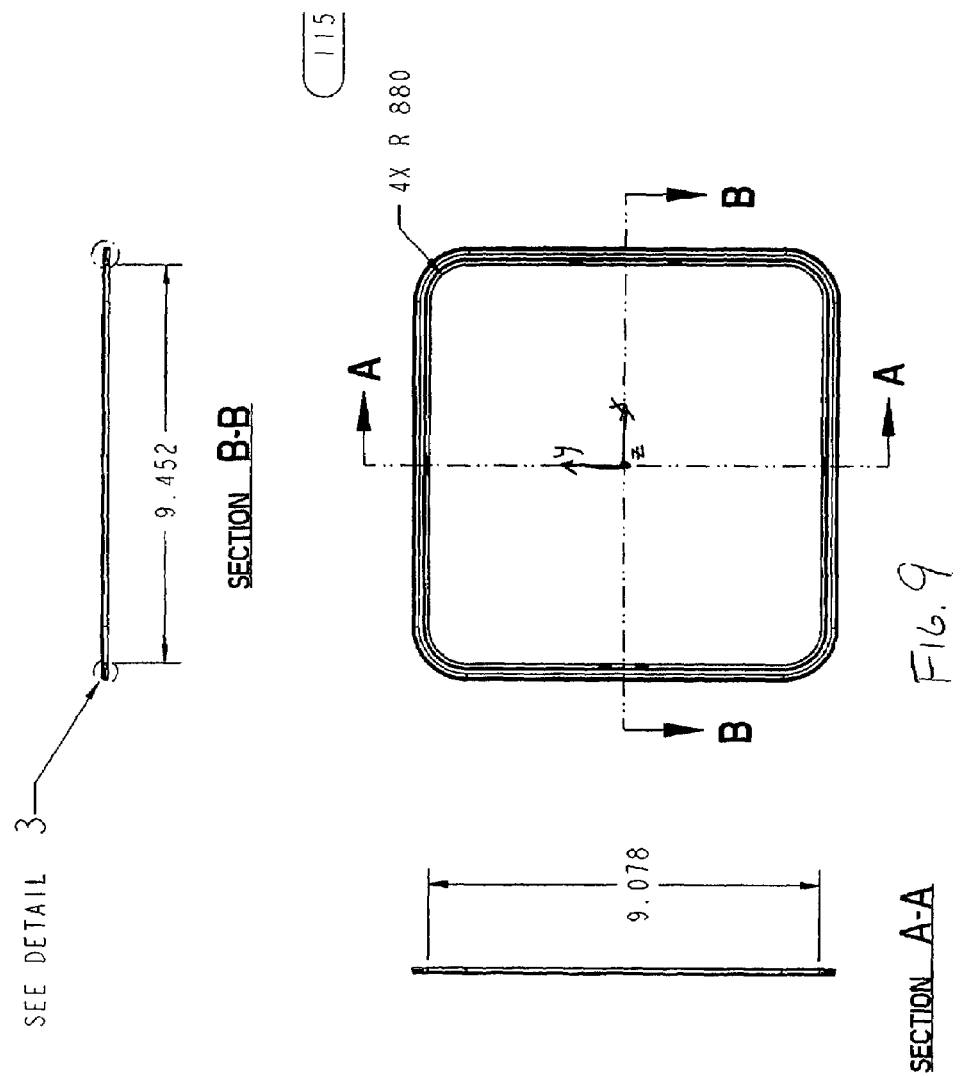

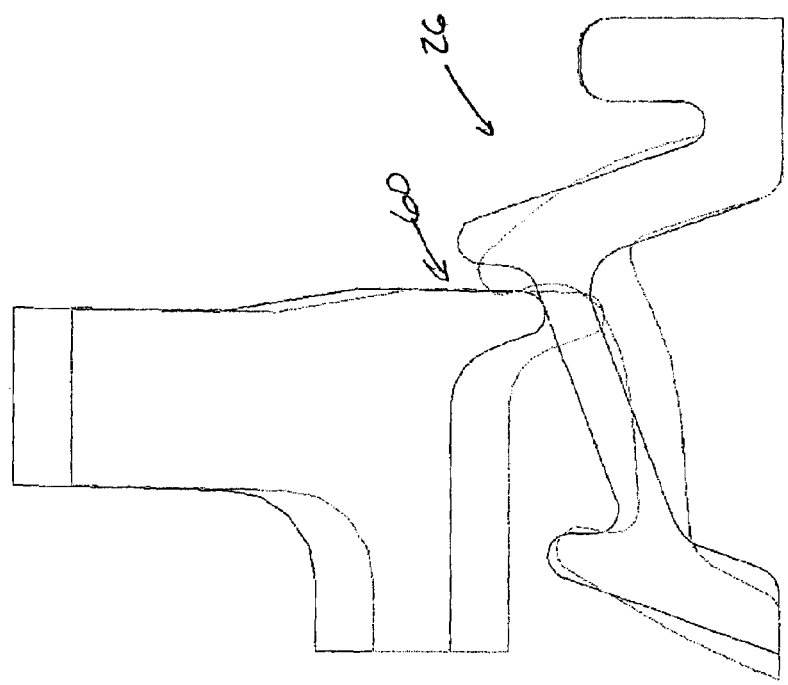

WAFER CONTAINER WITH SEALABLE DOOR

RELATED APPLICATIONS

This application claims the benefit of U.S. Provisional Patent Application No. 60/563,529 entitled WAFER CONTAINER WITH SEALABLE DOOR, filed Apr. 18, 2004, hereby fully incorporated herein by reference.

FIELD OF THE INVENTION

This invention relates to containers, and more particularly to sealable containers for semiconductor wafers.

BACKGROUND OF THE INVENTION

Semiconductor wafers are subjected to numerous steps during processing. This usually entails transporting a plurality of wafers between workstations or facilities for processing. Semiconductor wafers are delicate and easily damaged by physical contact or shock and by static electricity. Further semiconductor manufacturing processes are extremely sensitive to contamination by particulates or chemical substances. Consequently, in order to reduce the deleterious effect of contaminants on wafers, specialized containers have been developed to minimize the generation of contaminants and to isolate wafers from contaminants exterior to the containers. These containers typically include a removable door with gasketing or other means for providing a tight seal of the door with the container body.

As semiconductors have become smaller in scale, that is, as the number of circuits per unit area has increased, contaminants in the form of particulates have become more of an issue than previously. The size of particulates that can destroy a circuit has decreased and is approaching the molecular level. Consequently, ever better particulate control is desirable during all phases of manufacturing, processing, transporting, and storage of semiconductor wafers.

Wafer carriers are typically made from thermoplastic materials. Early containers, for example the container disclosed in U.S. Pat. No. 4,248,346, were made of highly moldable plastics such as polyethelene. Later containers, such as disclosed in U.S. Pat. No. 5,273,159, held rigid h-bar carriers, and are often made from polycarbonate with molded in slots and with softer, more resilient, covers such as disclosed in U.S. Pat. No. 5,586,658 for example. Each of U.S. Pat. Nos. 4,248,346; 5,273,159; and 5,586,658 are hereby fully incorporated herein by reference.

Some of the prior containers have a door to enclosure portion seal and also have the capability to sealingly engage to process equipment. Such containers have been termed "SMIF pods" (Standard Mechanical Interface) where the door closes an open bottom of the container portion, or FOUPs (Front Opening Unified Pods) and FOSBs (Front Opening Shipping Box) where the door closes an open front. These containers are subjected to very demanding structural requirements and performance requirements. For example, they must be mechanically sealably latchable by both robotic and manual means and must be hermetically sealable simply by closing and latching the door in place on the container.

Conventional seals for both SMIF pods and transport modules have typically been relatively simple elastomeric seals that are simply compressed between the door and enclosure portion in an axial direction to provide the seal. Such seals, particularly where polycarbonate material is contacted by the elastomeric seal, tend to stick excessively and provide inconsistent opening, reduced life expectancy of the seal and inadequate sealing.

More recent designs have featured seal cross-sections that feature a bridging portion that extends radially outward to a perpendicular distal portion, and provide a seal by knife edge contact with the bridging portion as well as axial compression of the distal portion. An example of such a design is found in U.S. patent application Ser. No. 09/998,621 entitled "SEALING ELEMENT, HERMETIC CONTAINER AND SEALING METHOD THEREOF" by Takahashi, et. al., hereby fully incorporated herein by reference. A problem with this approach, however, is "divergent column buckling" of the distal portion, wherein the free end of the distal portion buckles radially inward throughout one tangential segment of the seal, but buckles radially outward at a different tangential segment. Such a scenario allows for the seal to leak at the transition point between the inward and outward buckling.

What is needed in the industry is a better performing and longer lasting seal structure for sealing a door with the enclosure of a wafer container.

SUMMARY OF THE INVENTION

The present invention addresses the need of the industry for a better performing and longer lasting seal structure for a wafer container by providing an elastomeric seal that does not rely on direct compression as it seals. In accordance with the invention, a wafer container includes an enclosure portion with a door frame defining an opening for insertion and removal of wafers and a door fittable in the door frame to seal the enclosure portion. In an embodiment of the invention, a continuous elastomeric seal extends around the door inward of the periphery. The seal is positioned on a sealing surface proximate the perimeter of the door and may be partially inset in a radial groove in the door. In cross-section, the elastomeric seal has an inset portion, a bridging portion coupled therewith extending radially outward with respect to the axis of the door, and a sealing head coupled with the bridging portion. The sealing head includes a foot portion projecting from the bridging portion toward the sealing surface of the door, and a head portion extending in a direction generally opposite the foot relative to the bridging portion. The door frame has a seal engaging structure, such as a rib extending around the door frame, so that when the door is seated in the door frame, the bridging portion of the elastomeric seal contacts the seal engaging structure. The seal engaging structure displaces the bridging portion axially toward the sealing surface and causes the head of the sealing head to rotate radially and contact the seal engaging structure. The displacement action also affirmatively sets the foot of the sealing head in contact with the sealing surface of the door.

Alternatively, the frame can be dimensioned such that when the door is seated, the bridging portion of the elastomeric seal is compressed interstitially between the sealing surface of the door and the sealing surface of the door frame.

An advantage of the present invention is that a dual seal is effected on each side of the elastomeric seal. With respect to the door frame and seal interface, there is a sealing line of contact between the protrusion on the frame and the bridging portion of the seal, as well as a sealing line of contact between the head of the sealing head and the tangential perimeter of the protrusion on the frame. With respect to the interface between the seal and the sealing surface on the door, there is a sealing line of contact between the foot of the sealing head and the sealing surface of the door, as well as a sealing line of contact between an outer corner of the inset portion and the sealing surface of the door.

Another advantage is that the rotation action eliminates the potential of divergent column buckling because there is no axial compression of the sealing head. Rather, the sealing action of the sealing head is accomplished by the predictable and repeatable rotation of the head of the sealing head. Also, there will tend to be less sticking in absence of compression of the sealing head because the contact force between the seals and the surface is reduced.

A further advantage of preferred embodiments of the invention is that the seal can be easily replaced when it is worn out or when different sealing characteristics are desired.

DETAILED DESCRIPTION OF THE PREFERRED EMBODIMENTS

Figure 1:
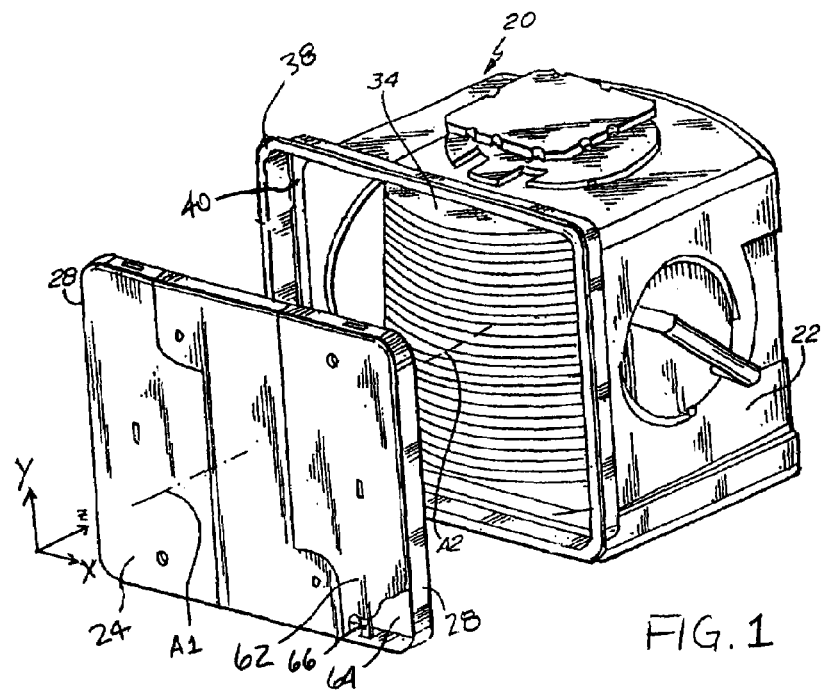
FIG. 1 is a perspective view of an embodiment of a front-loading wafer container according to the invention.
Figure 2:
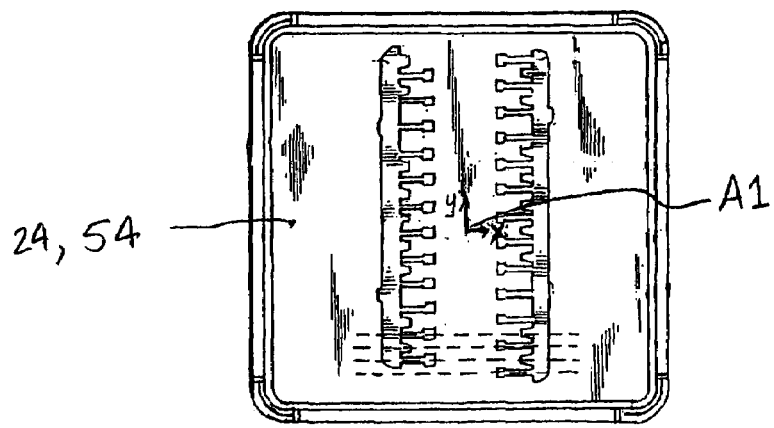
FIG. 2 is an interior view of the door of the wafer container of FIG. 1.

Referring to FIGS. 1-2, a wafer container 20 commonly known as a transport module generally includes enclosure portion 22 and door 24. Enclosure portion 22 generally includes shell 26 defining interior space 28 for enclosing a plurality of wafers 30. Shell 26 has a pair of opposing side walls 32, 34, top 36, bottom 38, and back 40. Open front 42 opposes back 40 and is defined by door frame 44 which receives door 24 for hermetically sealingly enclosing interior space 28. It should be noted that, when used herein, "door frame" is not limited to a separate structure from enclosure portion 22 nor additional structure on or integral with enclosure portion 22. Rather "door frame" is defined to be simply the portion of the enclosure portion 22 which receives the door 24. Enclosure portion 22 may also include a robotic lifting flange 46 on top 36, manual handles 48 on side walls 32, 34, and a kinematic coupling having grooves 49 on the exterior surface of bottom 38.

Door 24 generally includes chassis portion 50 and exterior panels 52 and presents an interior surface 54 and an exterior surface 56. Door 24 presents an axis annotated in the Figures as "A1" and the closure portion presents an axis annotated in the Figures as "A2." For proper insertion of door 24 into door frame 44, axes A1 and A2 should be axially aligned. When door 24 is inserted into door frame 44, door 24 moves in an axial direction. When "radial" is used herein, it refers to direction or orientations normal to the axis A1 or A2.

Door sealing surface 58 extends around a portion of door interior surface 54 adjacent perimeter 60 of door 24. Door 24 generally has one or more latching mechanisms 62 in chassis portion 50, operable through key holes 63, for latching door 24 securely in place in door frame 44. Latching mechanisms 62 may operate as disclosed in U.S. Pat. No. 5,711,427 to David L. Nyseth and owned by the owner of the instant invention, hereby fully incorporated herein by reference. Door 24 may further have door guides 64 at each corner 66 for accurately locating and positioning door 24 in door frame 44. Also, wafer cushions 68 having resilient fingers 70 for engaging one of the plurality of wafers 30 may be provided on interior surface 54 of door 24.

Figure 3:
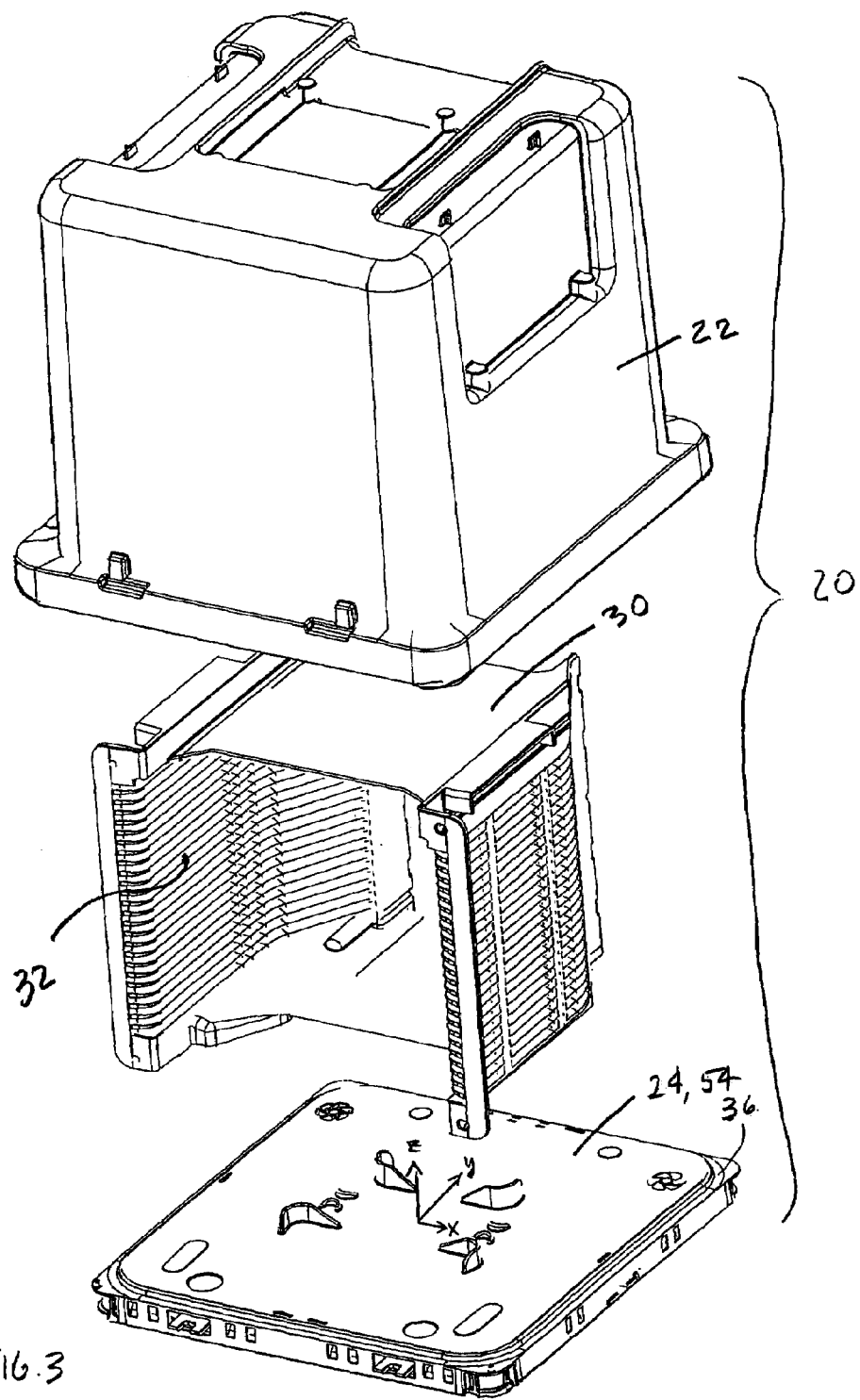
FIG. 3 is an top perspective view of an embodiment of a bottom-loading wafer carrier according to the invention.
Figure 8:
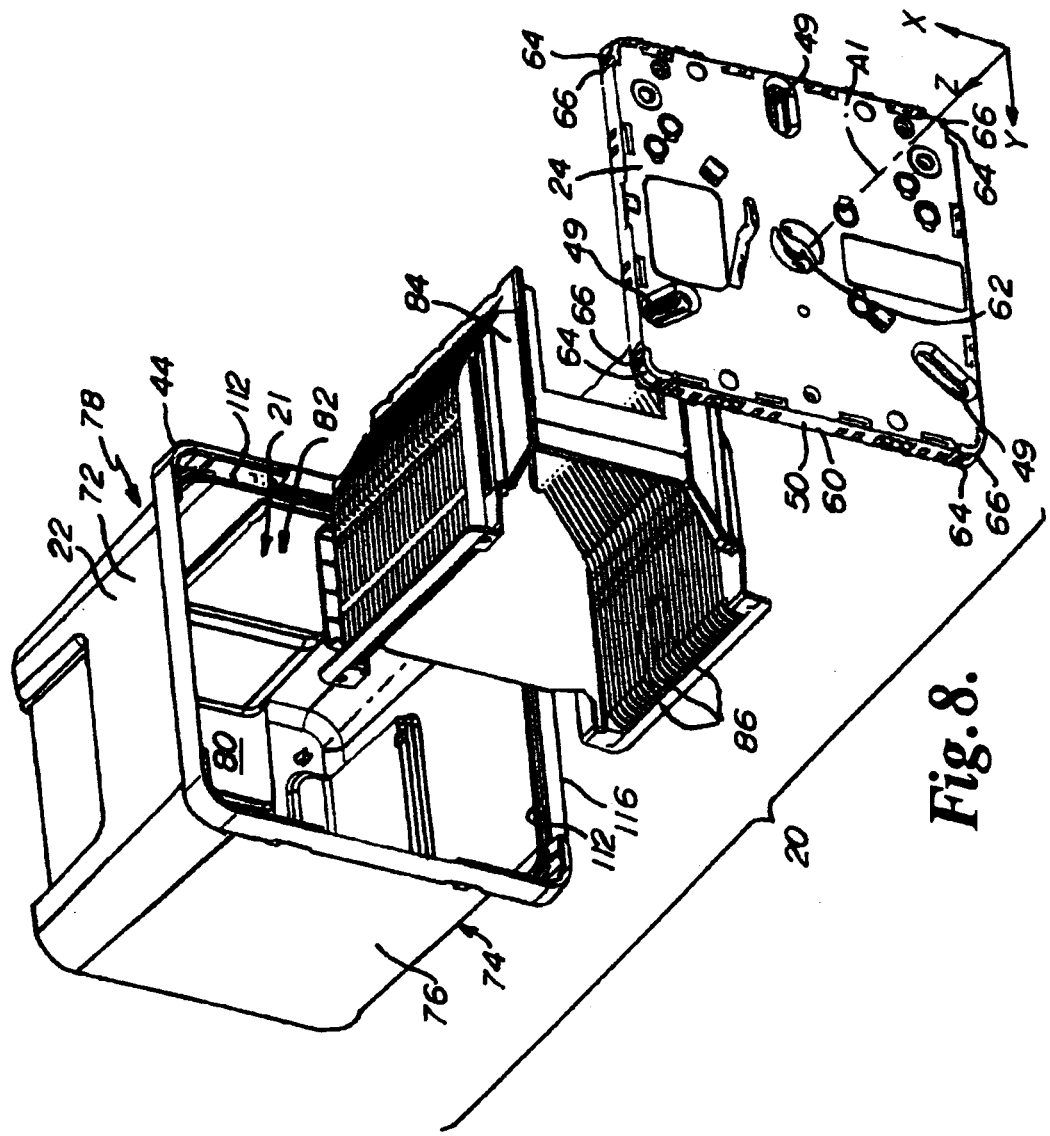
FIG. 8 is a bottom perspective view of the bottom-loading wafer carrier of FIG. 3.
Figure 10:
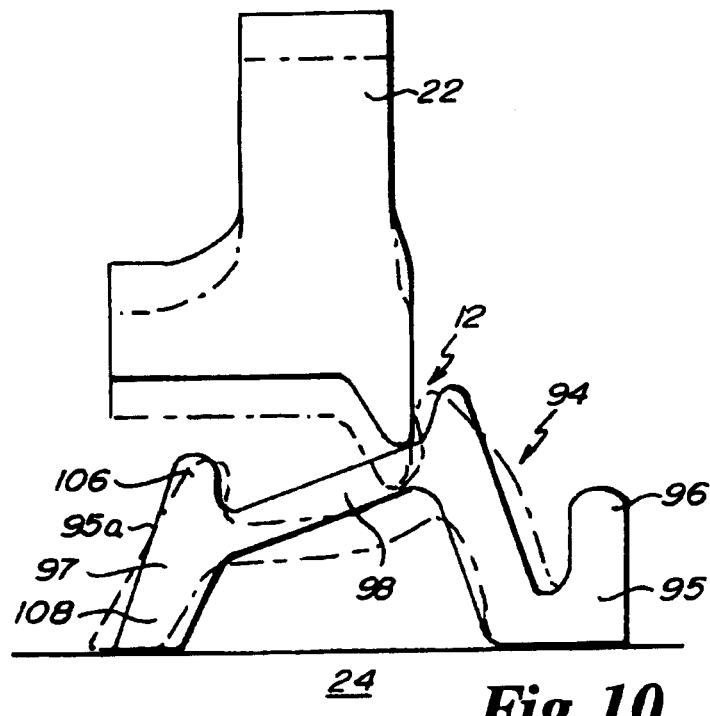
FIG. 10 is a cross-sectional view of an embodiment of the wafer carrier of the present invention, depicting the elastomeric seal and seal engaging portion in undeflected and deflected positions.
Figure 11:
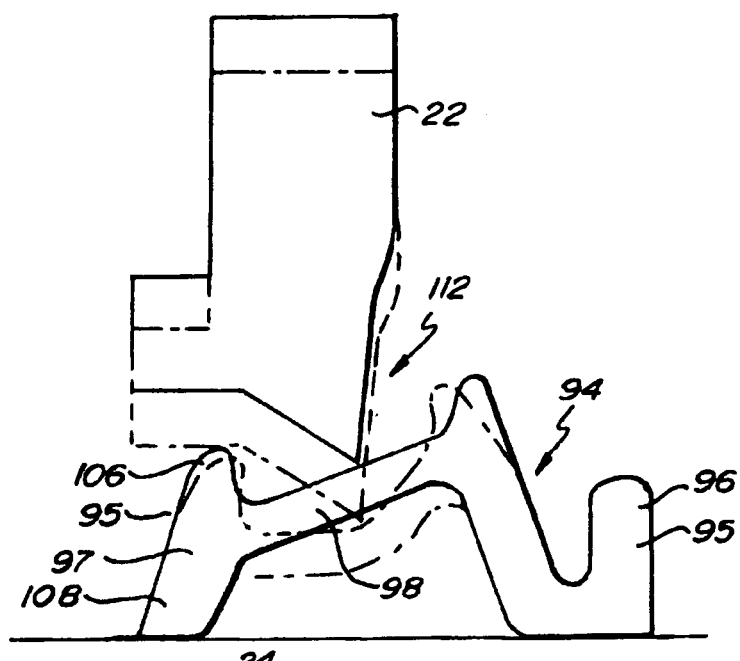
Figure 12:
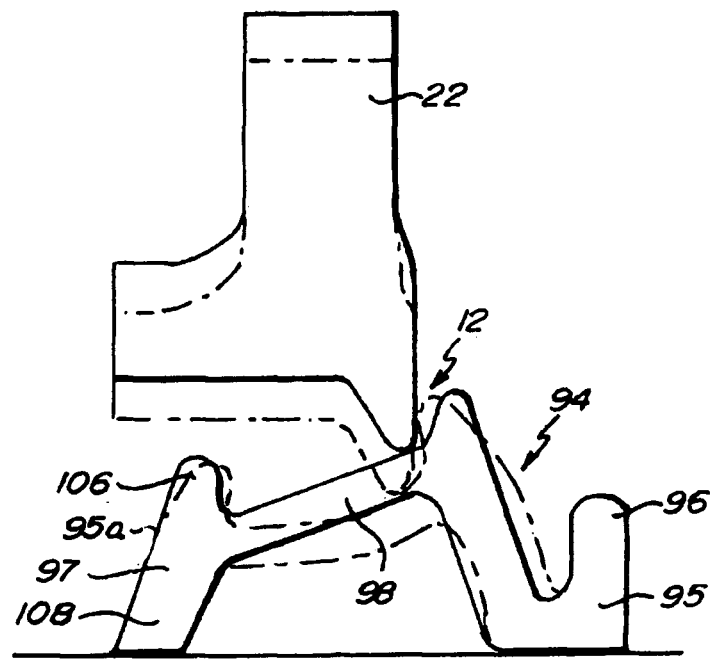
Figure 13:
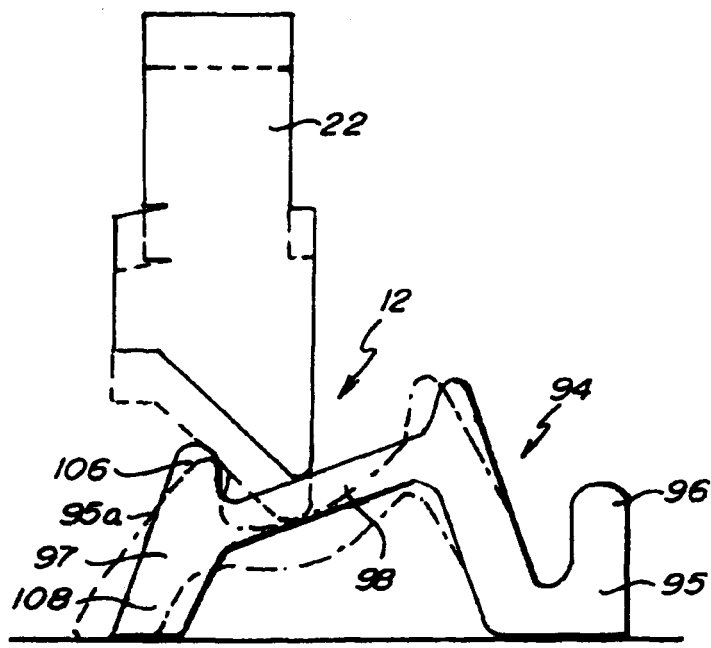
Figure 14:
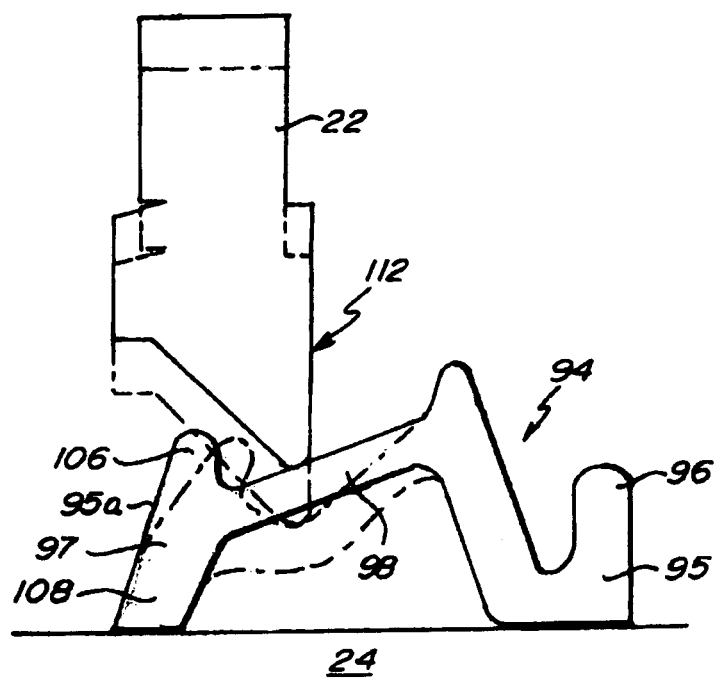

An alternative embodiment of a wafer container 20, known as a SMIF (Standard Mechanical Interface) pod is depicted in FIGS. 3 and 8. In this embodiment, wafer container 20 also generally includes enclosure portion 22 and door 24. Enclosure portion 22 generally includes side walls 72, 74, 76, 78, and top 80 which opposes an open bottom 82. As with open front 42 of the embodiment of FIGS. 1-2, open bottom 82 is defined by door frame 44 which receives door 24 for hermetically sealingly enclosing interior space 28.

Door 24 in the embodiment of FIGS. 3 and 8 includes chassis portion 50 and presents an interior surface 54 and an exterior surface 56. Again, door sealing surface 58 extends around a portion of the door interior surface 54 adjacent the perimeter 60 of the door 24. Door 24 generally has one or more latching mechanisms 62 in chassis portion 50 for latching door 24 securely in place in door frame 44. Door 24 may further have door guides 64 at each corner 66 for accurately locating and positioning door 24 in door frame 44. Wafer support structure 84 having a plurality of wafer receiving shelves 86 is engaged on structures 88 on interior surface 54 of door 24.

Figure 4:
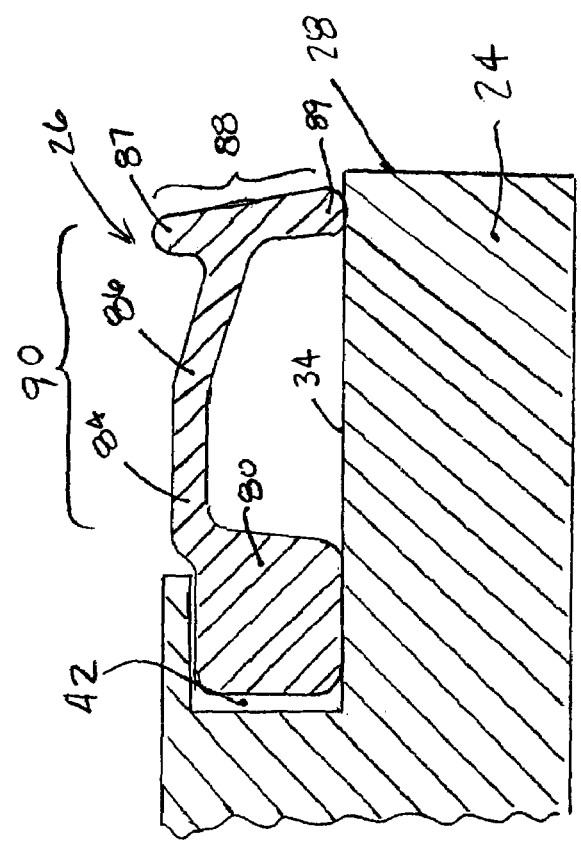
FIG. 4 is a cross-sectional view of an embodiment of an elastomeric seal according to the invention positioned on a wafer container door.
Figure 4:

FIG. 4 depicts a cross sectional view of door 24 proximate perimeter 60. Door sealing surface 58 is bounded by periphery 90 of door 24 and inset radial groove 92. Elastomeric seal 94 extends around and inward of periphery 90 over seal engaging surface 58 and presents a pair of opposing edges 95, 95a. Elastomeric seal 94 generally includes an attachment portion 96 extending along inner edge 95 and a sealing head portion 97 extending along outer edge 95a. Elastomeric seal 94 has a greater dimension ΔR in a radial direction and a lesser dimension ΔZ in an axial direction. Bridging portion 98 extends between attachment portion 96 and sealing head portion 97 and generally includes a proximal portion 100 connected with attachment portion 96 and intermediate portion 102 connected with sealing head 97. Sealing head 97 generally includes head portion 106, which extends axially and away from door sealing surface 58, and foot portion 108 that extends toward and confronts door sealing surface 58. Bridging portion 98 and sealing head 97 in this embodiment have a generally t-shaped cross-section. Attachment portion 96 of elastomeric seal 94 is received in inset radial groove 92 of door 24 as depicted.

Figure 6:
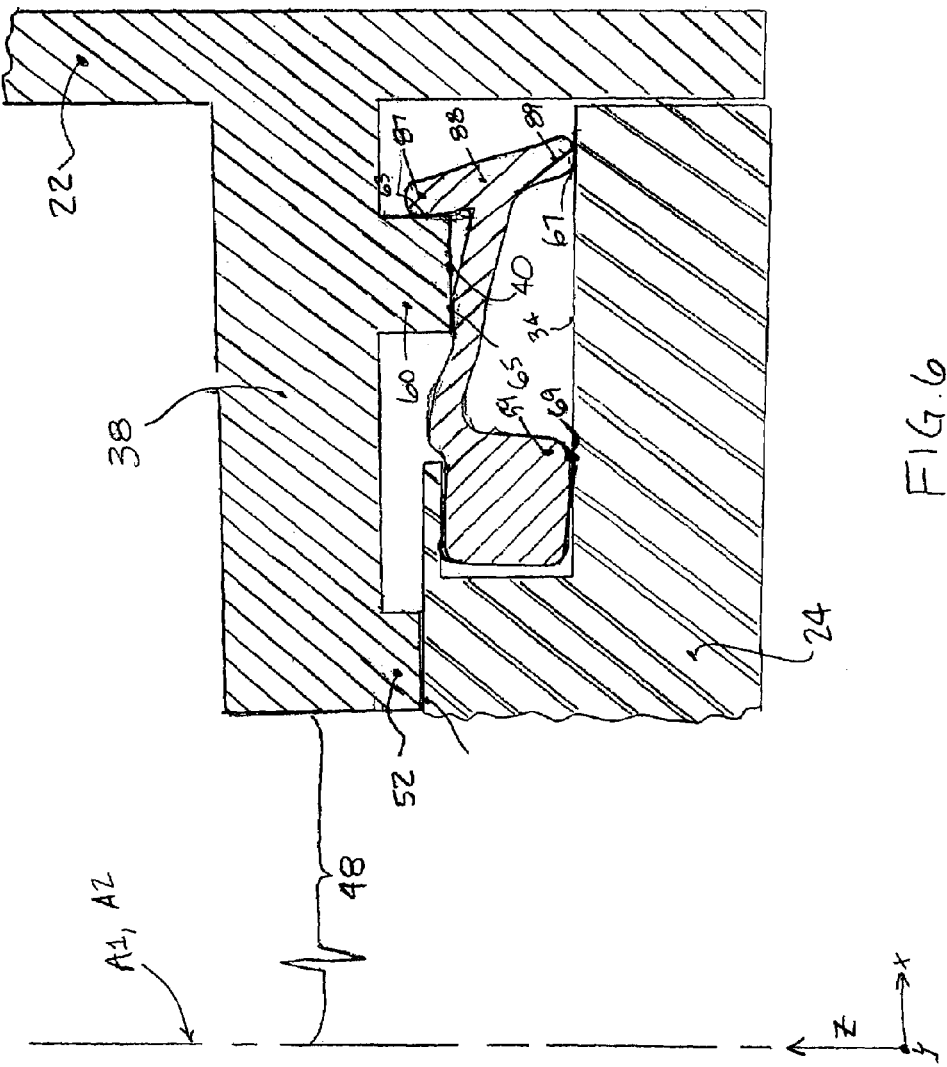
FIG. 6 is a cross-sectional view of an elastomeric seal according to the present invention depicting the engagement of the seal between the door and the door frame of a wafer container.

Referring now to the cross-sectional view of FIG. 6, door 24 is engaged in door frame 44. In the depicted embodiment, door frame 44 is integral with enclosure portion 22 and generally includes a standoff structure 110 and a seal engagement protrusion 112 in the form of a continuous rib extending around the periphery of the door frame and extending into the recess 114 defined by outer flange wall 116. Seal engagement protrusion 112 presents frame sealing surface 118. Standoff structure 110 engages door interior surface 54, thereby axially locating frame sealing surface 118 relative to door 24 and establishing a depth of engagement for door 24 in door frame 44. It will be appreciated that standoff structure 110 may be suitably dimensioned or shimmed to control the contact force between elastomeric seal 94 and seal engagement protrusion 112.

Significantly, elastomeric seal 94 is not substantially compressed when door 24 is engaged in door frame 44; rather seal engagement protrusion 112 deflects bridging portion 98 of elastomeric seal 94. This engagement causes four separate sealing lines of contact between elastomeric seal 94, enclosure portion 22 and door 24. Head portion 106 of sealing head 97 deflects radially inward and contacts tangential perimeter 120 of seal engagement protrusion 112, forming first line of contact 122. Second line of contact 124 is formed between intermediate portion 102 of bridging portion 98 and frame sealing face 118. Third line of contact 126 is formed between foot portion 108 of sealing head 97 and door sealing surface 58. Finally, fourth line of contact 128 is formed between corner 130 of attachment portion 96 and door sealing surface 58.

Figure 7:
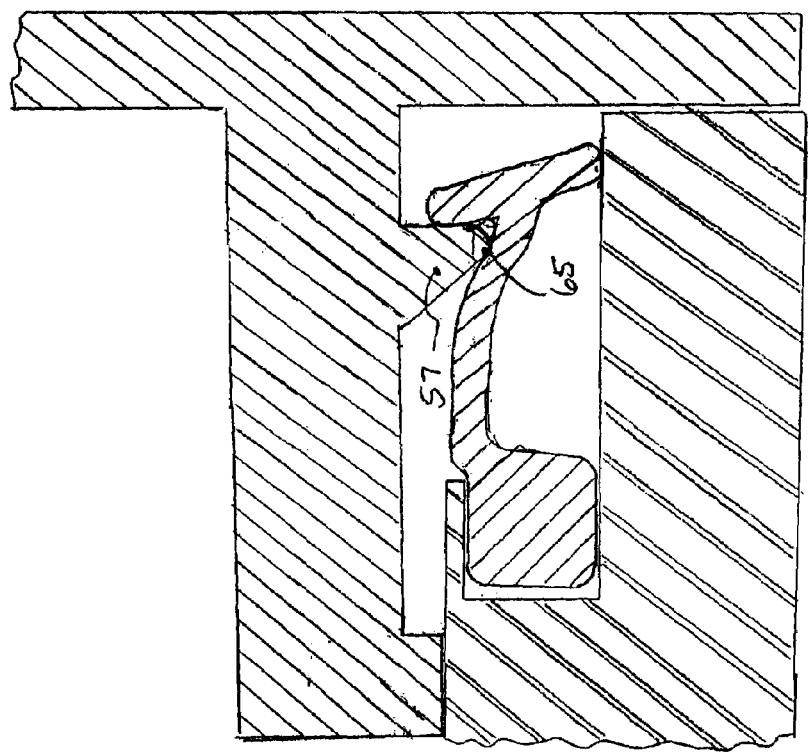
FIG. 7 is a cross-sectional view of an elastomeric seal according to an alternative embodiment of the present invention depicting the engagement of the seal between the door and the door frame of a wafer container.
Figure 11:
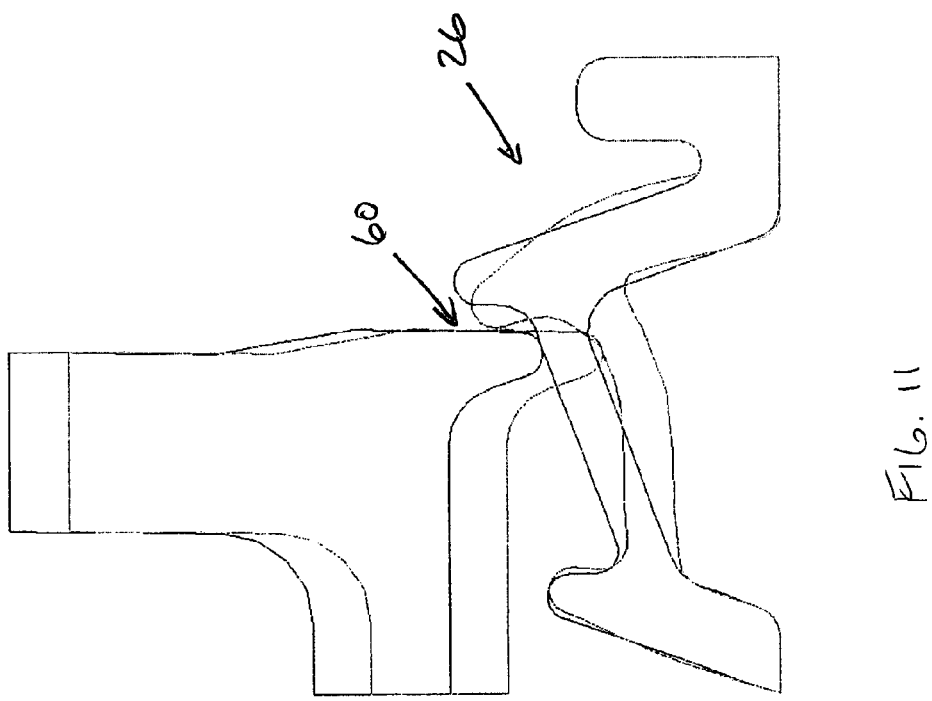
FIG. 11 is a cross-sectional view of another alternative embodiment of the wafer carrier of the present invention, depicting the elastomeric seal and seal engaging portion in undeflected and deflected positions.
Figure 12:
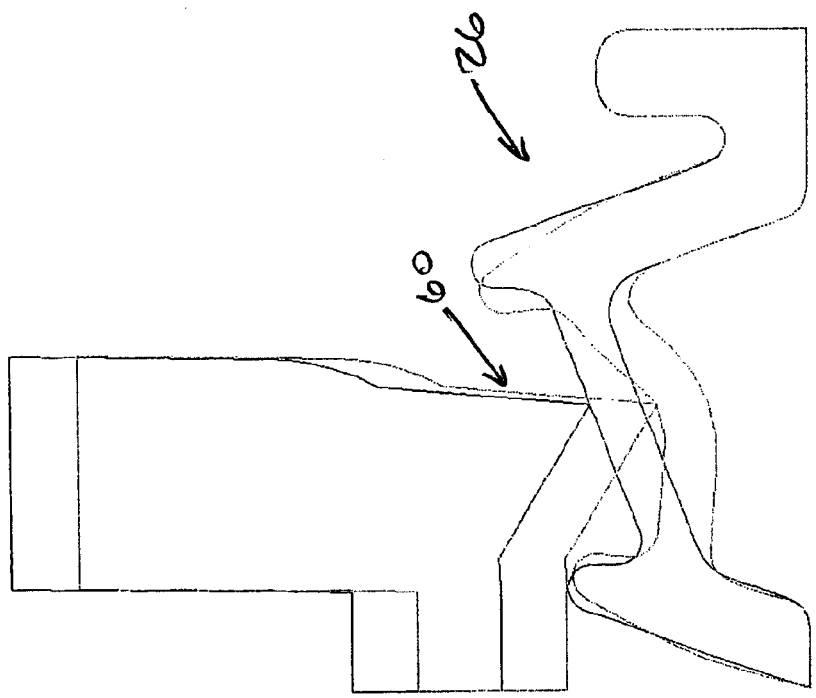
FIG. 12 is a cross-sectional view of still another alternative embodiment of the wafer carrier of the present invention, depicting the elastomeric seal and seal engaging portion in undeflected and deflected positions.
Figure 13:
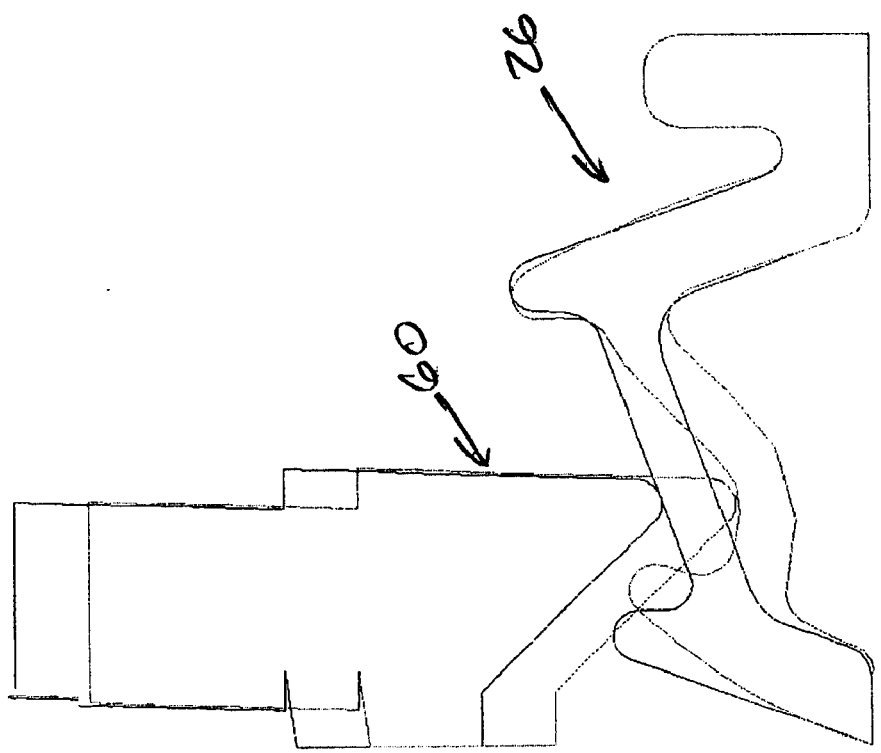
FIG. 13 is a cross-sectional view of yet another alternative embodiment of the wafer carrier of the present invention, depicting the elastomeric seal and seal engaging portion in undeflected and deflected positions.
Figure 14:
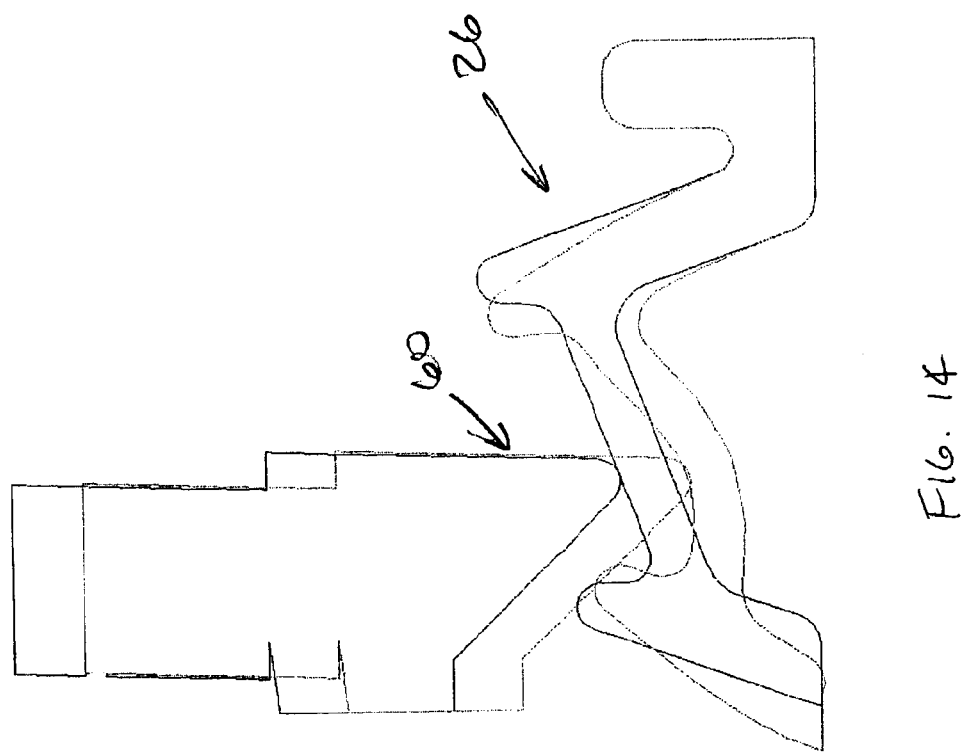
FIG. 14 is a cross-sectional view of yet another alternative embodiment of the wafer carrier of the present invention, depicting the elastomeric seal and seal engaging portion in undeflected and deflected positions.
Figure 1:
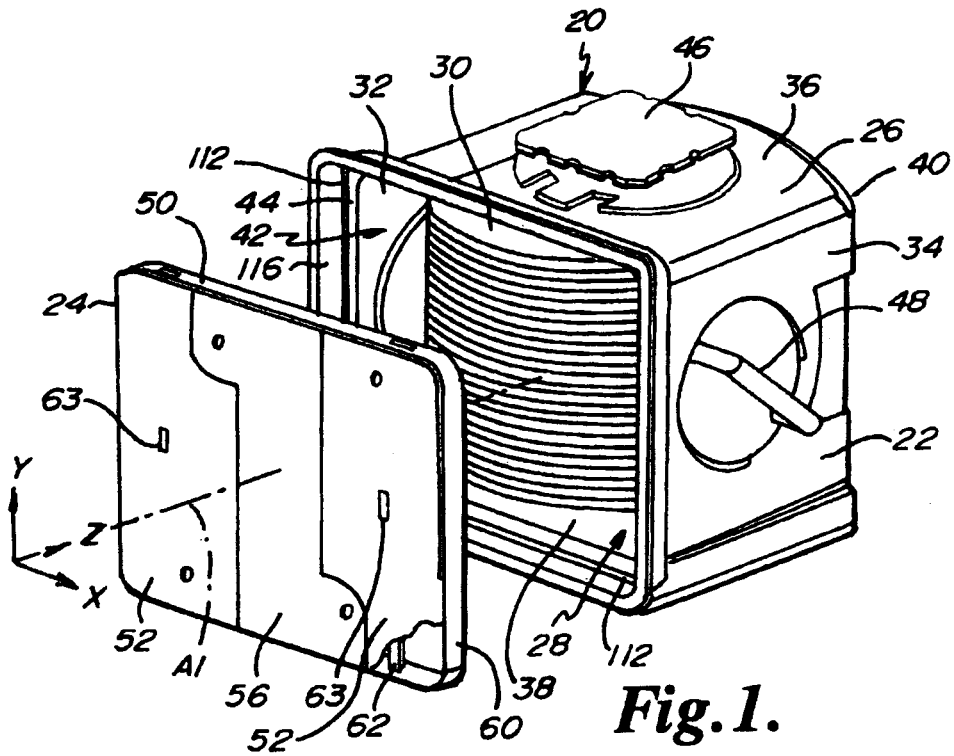
Figure 2:
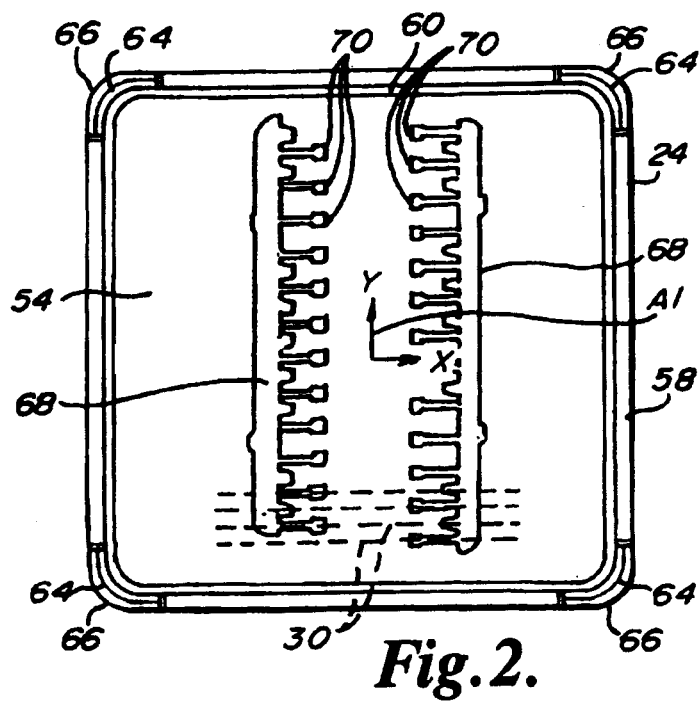
Figure 3:
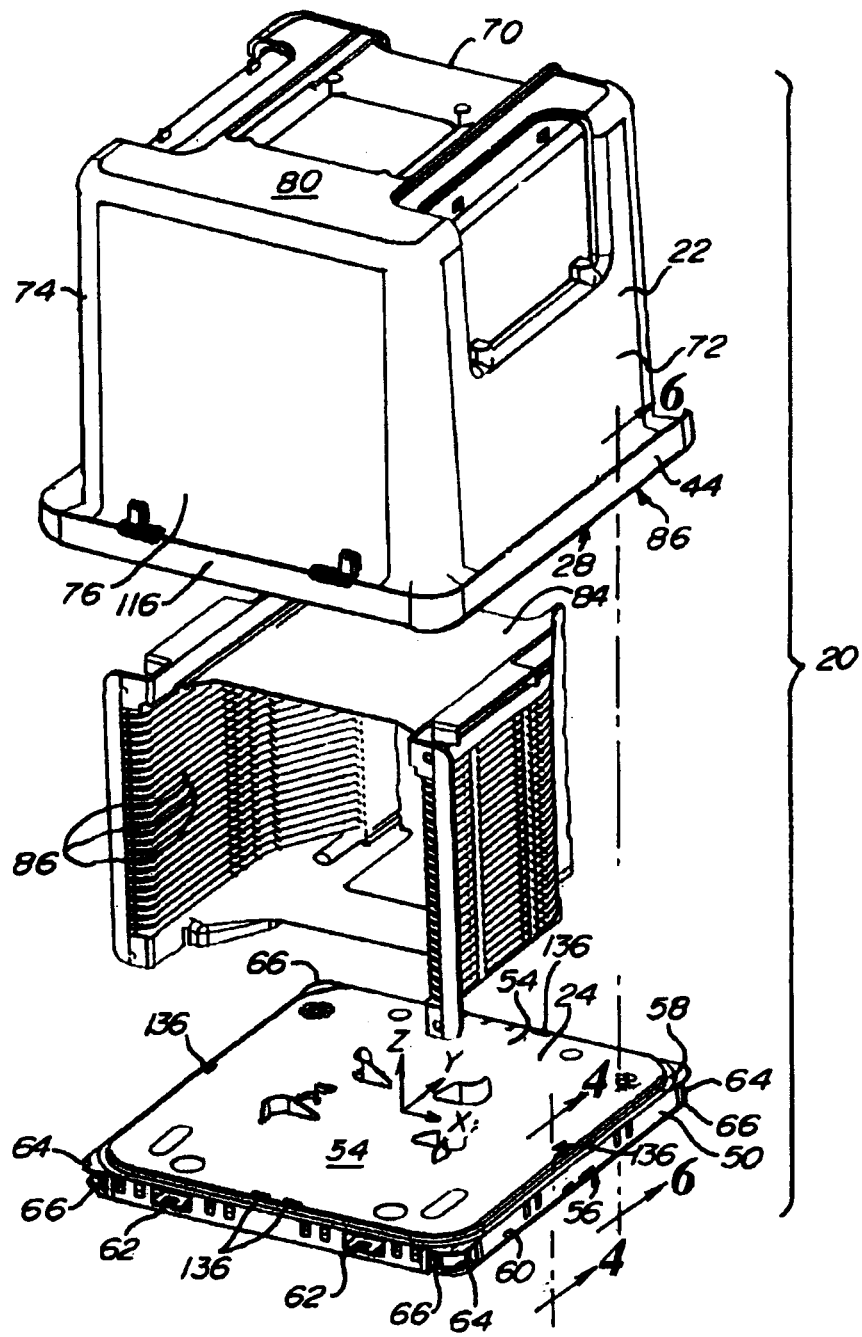
Figure 4:
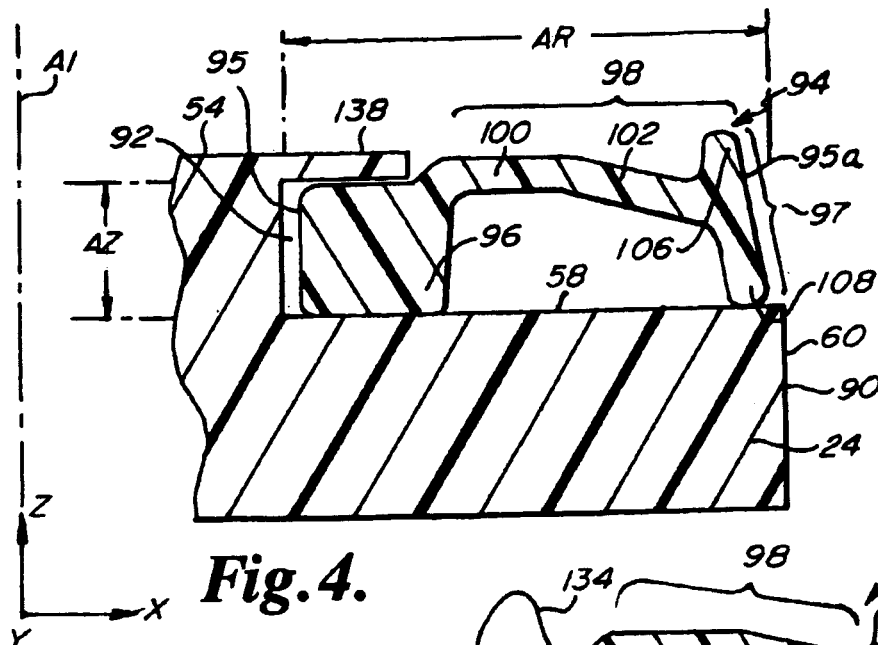
Figure 5:
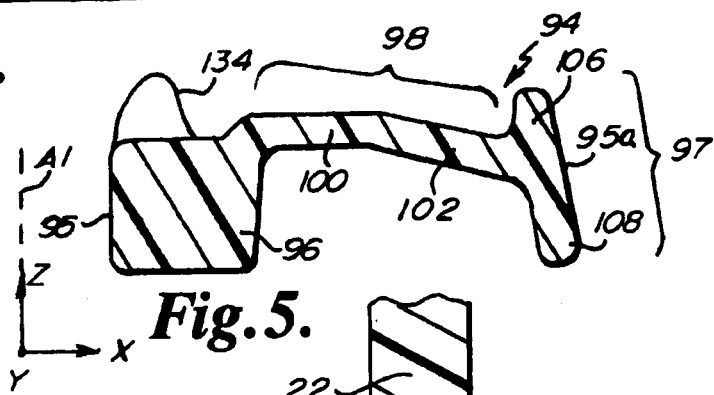
Figure 6:
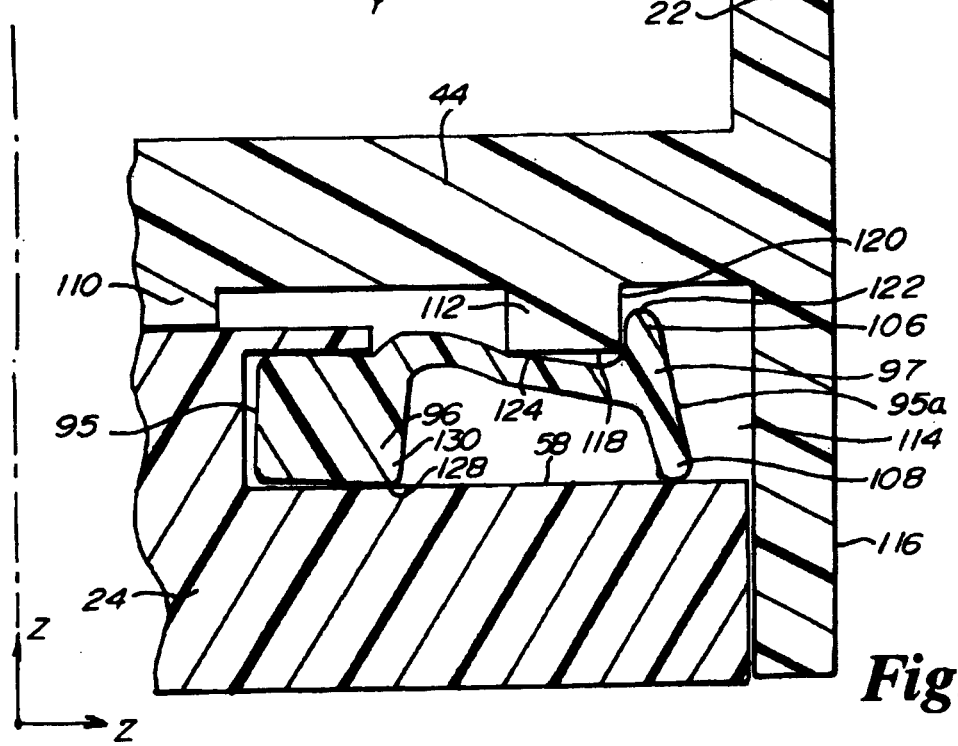
Figure 7:
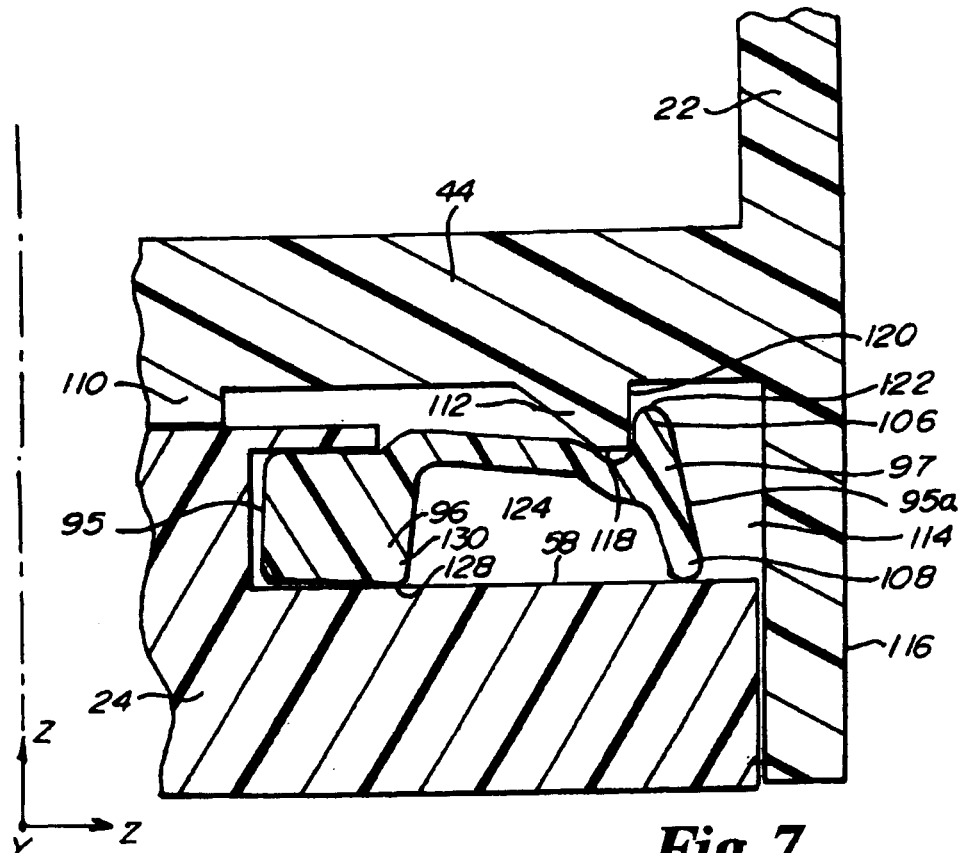
Figure 9:
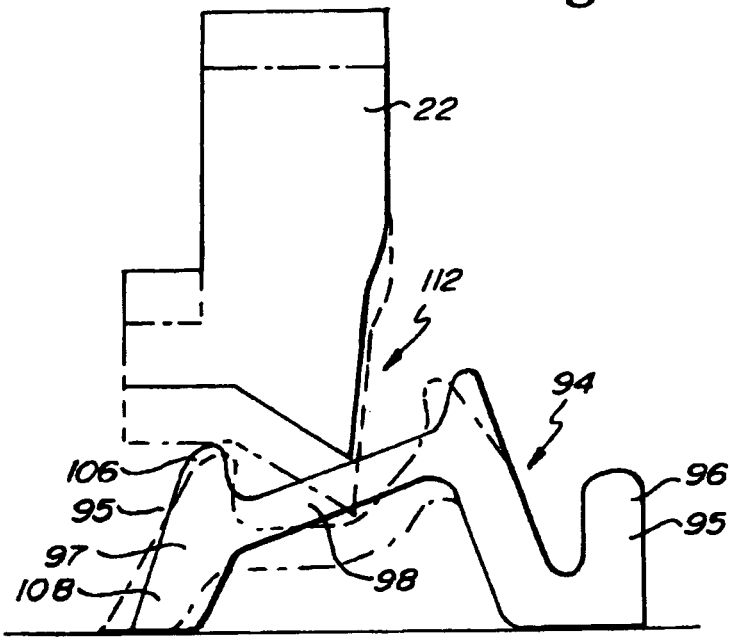
FIG. 9 is a cross-sectional view of an alternative embodiment of the wafer carrier of the present invention, depicting the elastomeric seal and seal engaging portion in undeflected and deflected positions.

An alternative embodiment of the invention is depicted in FIG. 7. In this embodiment, door frame 44 is substantially the same except that engagement protrusion 112 has a rounded knife edge engaging portion 132. Second line of contact 124 is therefore formed between nose 134 of rounded knife edge engaging portion 132 and intermediate portion 102 of bridging portion 98 with the other lines of contact in the same positions as before.

Figure 5:
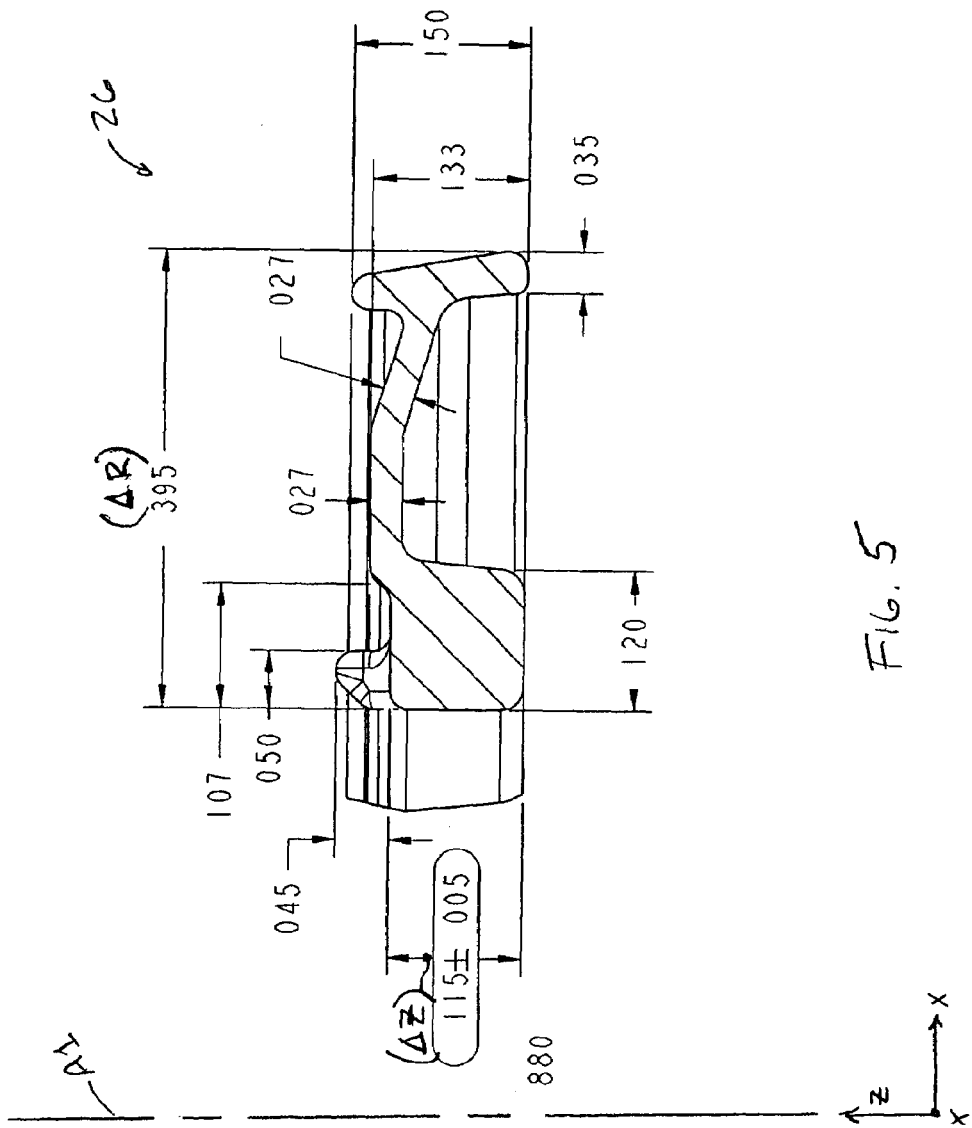
FIG. 5 is a cross-sectional view of an alternative embodiment of an elastomeric seal according to the present invention.

In an embodiment, elastomeric seal 94 may feature a plurality of protrusions 134, depicted in the cross-sectional view of FIG. 5. Protrusions 134 project from attachment portion 96 at pre-determined intervals. Protrusions 134 fit into thru-slots 136 defined in radially extending lip 138 which bounds inset radial groove 92, to secure elastomeric seal 94 in place in inset radial groove 92. As depicted in FIG. 3, the number and placement of the thru-slots 136 and protrusions 134 may be asymmetric with respect to adjacent sections to affect an indexed installation of elastomeric seal 94.

Various other preferred embodiments of elastomeric seal 94 according to the invention are depicted in FIGS. 9 through 14, both free standing and in engagement with various geometries for the engagement protrusions 134 and the deflected state shown in phantom.

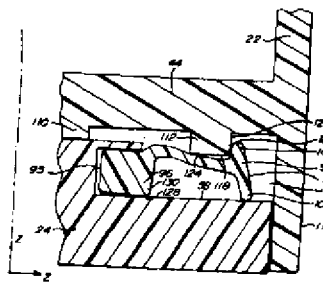

What is claimed is:

1. A sealable container for holding a plurality of wafers, the container comprising:
    an enclosure portion defining an interior space for receiving the wafers, the enclosure portion having an open side defined by a door frame, the door frame presenting a frame periphery and having a seal engaging member disposed around the frame periphery and protruding outwardly from the door frame, the seal engaging member configured as a continuous rib having a tip, an inwardly facing surface and an outwardly facing surface;
    a door fittable in the door frame to sealingly close the open side of the enclosure portion, the door having an interior side and presenting a door periphery; and
    an elastomeric seal disposed on the interior side of the door around and inward of the door periphery, the elastomeric seal having an inside edge and an outside edge, the inside edge with an attachment structure for securement to a groove in the door extending therealong, a sealing head structure extending along the outside edge, and a bridging portion coupling the attachment structure and the sealing head structure, the bridging portion and sealing head structure have a T-shape with one arm of the T contacting the door and an opposing arm extending outwardly away from the inside surface of the door, the seal engaging member and the elastomeric seal cooperatively positioned so that when the door is engaged in the door frame, the tip of the seal engaging member first contacts the bridging portion of the elastomeric seal defining a first sealing line of contact along the door periphery, the engagement with the bridging portion pulling the one arm of the T opposite the door in a direction inwardly toward the attachment portion whereby said one arm of the T-shaped portion engages the outwardly facing surface of the seal engaging member defining a second sealing line of contact along the door periphery, and the sealing head structure being in contact with the door defining a third sealing line of contact along the door periphery.

2. The container of claim 1, wherein the attachment structure contacts the door defining a fourth sealing line of contact along the door periphery.

3. The container of claim 1, further comprising a standoff structure on the enclosure portion for establishing a depth of engagement for the door when the door is fitted in the door frame.

4. The container of claim 1, wherein the attachment structure has a plurality of projections and wherein the door has a plurality of structures for receiving the projections to retain the elastomeric seal on the door.

5. The container of claim 1, thither comprising at least one latching mechanism operably coupled with the door for latching the door in place in the door frame.

6. The container of claim 1, wherein the seal engaging member has a knife edge engaging portion.

* * * * *

UNITED STATES PATENT AND TRADEMARK OFFICE
CERTIFICATE OF CORRECTION

PATENT NO. : 7,578,407 B2
APPLICATION NO. : 11/108349
DATED : August 25, 2009
INVENTOR(S) : Tieben et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 990 days.

Signed and Sealed this

Fourteenth Day of December, 2010

David J. Kappos
*Director of the United States Patent and Trademark Office*

UNITED STATES PATENT AND TRADEMARK OFFICE
CERTIFICATE OF CORRECTION

| | | |
|---|---|---|
| PATENT NO. | : 7,578,407 B2 | |
| APPLICATION NO. | : 11/108349 | |
| DATED | : August 25, 2009 | |
| INVENTOR(S) | : Anthony Mathius Tieben and John Lystad | |

It is certified that error appears in the above-identified patent and that said Letters Patent is hereby corrected as shown below:

The title page should be deleted and substitute therefore the attached title page.

Drawings:
Delete drawing sheets 1-14, and substitute therefore the attached drawing sheets, consisting of Figs. 1-14, as shown on the attached pages.

Col. 6, line 60, claim 5. - "Thither" should be "Further".

Signed and Sealed this
Seventeenth Day of January, 2012

David J. Kappos
*Director of the United States Patent and Trademark Office*

(12) United States Patent
Tieben et al.

(10) Patent No.: US 7,578,407 B2
(45) Date of Patent: Aug. 25, 2009

(54) WAFER CONTAINER WITH SEALABLE DOOR

(75) Inventors: Anthony Mathius Tieben, Jordan, MN (US); John Lystad, Bloomington, MN (US)

(73) Assignee: Entegris, Inc., Chaska, MN (US)

( * ) Notice: Subject to any disclaimer, the term of this patent is extended or adjusted under 35 U.S.C. 154(b) by 534 days.

(21) Appl. No.: 11/108,349

(22) Filed: Apr. 17, 2005

(65) Prior Publication Data

US 2005/0230284 A1    Oct. 20, 2005

Related U.S. Application Data

(60) Provisional application No. 60/563,529, filed on Apr. 18, 2004.

(51) Int. Cl.
  B65D 45/16   (2006.01)
  B65D 53/00   (2006.01)
  B65D 53/02   (2006.01)

(52) U.S. Cl. .................. 220/326; 220/378; 220/803; 220/804

(58) Field of Classification Search ............ 220/795, 220/378, 324, 803, 804, 326, 797
  See application file for complete search history.

(56) References Cited

U.S. PATENT DOCUMENTS

| | | | |
|---|---|---|---|
| 4,206,499 A * | 6/1980 | Urbanek et al. | 362/546 |
| 4,248,346 A | 2/1981 | Johnson | |
| 4,313,609 A * | 2/1982 | Clements | 277/641 |
| 4,349,206 A * | 9/1982 | Simm et al. | 277/612 |
| 4,709,834 A | 12/1987 | Mortensen et al. | |
| 5,273,159 A | 12/1993 | Gregerson | |
| 5,586,658 A | 12/1996 | Nyseth | |
| 5,611,452 A | 3/1997 | Bonora et al. | |
| 5,711,427 A | 1/1998 | Nyseth | |
| 5,740,845 A | 4/1998 | Bonora et al. | |
| 5,957,292 A | 9/1999 | Mikkelsen et al. | |
| 6,187,182 B1 | 2/2001 | Reynolds et al. | |
| 6,273,261 B1 | 8/2001 | Hosoi | |
| 6,354,601 B1 | 3/2002 | Krampotich et al. | |
| 6,663,148 B2 | 12/2003 | Bonora et al. | |

(Continued)

*Primary Examiner*—Anthony D Stashick
*Assistant Examiner*—Niki M Eloshway
(74) *Attorney, Agent, or Firm*—Patterson, Thuente, Skaar & Christensen, P.A.

(57) ABSTRACT

A wafer container including an enclosure portion with a door frame defining an opening for insertion and removal of wafers and a door fittable in the door frame to seal the enclosure portion. A continuous elastomeric seal extends around the door inward of the periphery. The seal is positioned on a sealing surface proximate the perimeter of the door and may be partially inset in a radial groove in the door. In cross-section, the elastomeric seal has an inset portion and a sealing head coupled by a bridging portion. The sealing head has a foot portion projecting from the bridging portion toward the sealing surface of the door, and a head portion extending in a direction generally opposite the foot relative to the bridging portion. The door frame has a seal engaging structure so that when the door is seated in the door frame, the bridging portion of the elastomeric seal contacts the seal engaging structure displacing the bridging portion axially toward the sealing surface and causing the head of the sealing head to rotate radially and contact the seal engaging structure. The displacement action also affirmatively sets the foot of the sealing head in contact with the sealing surface of the door.

6 Claims, 8 Drawing Sheets